(12) United States Patent
Mevellec et al.

(10) Patent No.: US 9,790,371 B2
(45) Date of Patent: *Oct. 17, 2017

(54) METHOD FOR PREPARING AN ORGANIC FILM AT THE SURFACE OF A SOLID SUPPORT UNDER NON-ELECTROCHEMICAL CONDITIONS, SOLID SUPPORT THUS OBTAINED AND PREPARATION KIT

(75) Inventors: Vincent Mevellec, Boulogne-Billancourt (FR); Sébastien Roussel, Soisy sur Seine (FR); Serge Palacin, Montigny le Bretonneux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 1536 days.

This patent is subject to a terminal disclaimer.

(21) Appl. No.: 11/753,394

(22) Filed: May 24, 2007

(65) Prior Publication Data

US 2008/0152949 A1 Jun. 26, 2008

Related U.S. Application Data

(63) Continuation-in-part of application No. 11/686,076, filed on Mar. 14, 2007.

(30) Foreign Application Priority Data

Dec. 19, 2006 (FR) .................................. 06 55653
Apr. 4, 2007 (FR) .................................. 07 54278

(51) Int. Cl.
*B05D 3/02* (2006.01)
*C09D 4/00* (2006.01)
(Continued)

(52) U.S. Cl.
CPC .................................... *C09D 4/00* (2013.01); *C08J 7/04* (2013.01); *H01L 51/0006* (2013.01); *H01L 51/0075* (2013.01)

(58) Field of Classification Search
CPC .......... B32B 17/10; B32B 15/09; C08L 31/00
(Continued)

(56) References Cited

U.S. PATENT DOCUMENTS 5,462,700 A * 10/1995 Beeson et al. ............... 264/1.27
6,458,458 B1 10/2002 Cooke et al.
(Continued)

FOREIGN PATENT DOCUMENTS

EP   1 258 504   11/2002
FR   2 829 046   3/2003
(Continued)

OTHER PUBLICATIONS

Kovalchuk et al. "Reduction of Diazonium Salts on a Copper Cathode in the Presence of Acrylamide" Zhurnal Obshchei Khimii (1982), 52 (11), 2540-2543.*

(Continued)

*Primary Examiner* — Robert S Walters, Jr.
(74) *Attorney, Agent, or Firm* — Nixon Peabody LLP; Khaled Shami

(57) ABSTRACT

This invention relates to a method for preparing an organic film at the surface of a solid support, with a step of contacting said surface with a liquid solution including (i) at least one protic solvent, (ii) at least one adhesion primer, and (iii) at least one monomer different from the adhesion primer and radically polymerisable, under non-electrochemical conditions, and allowing the formation of radical entities based on the adhesion primer. This invention also relates to a non-electrically-conductive solid support on which an organic film according to said method is grafted, and a kit for (Continued)

preparing an essentially polymeric organic film at the surface of a solid support.

29 Claims, 10 Drawing Sheets

(51) Int. Cl.
 *C08J 7/04* (2006.01)
 *H01L 51/00* (2006.01)

(58) Field of Classification Search
 USPC .......................................................... 427/384
 See application file for complete search history.

(56) References Cited

U.S. PATENT DOCUMENTS

| | | | |
|---|---|---|---|
| 7,119,030 B2* | 10/2006 | Bureau et al. | 438/758 |
| 8,133,549 B2 | 3/2012 | Bureau et al. | |
| 2002/0160295 A1* | 10/2002 | Aoshima et al. | 430/176 |
| 2008/0064783 A1 | 3/2008 | Chehimi et al. | |
| 2008/0278068 A1* | 11/2008 | Huang et al. | 313/504 |

FOREIGN PATENT DOCUMENTS

| | | |
|---|---|---|
| FR | 2 841 908 | 1/2004 |
| FR | 2 851 181 | 8/2004 |
| WO | 03/018212 | 3/2003 |
| WO | 2006/000692 | 1/2006 |
| WO | 2007/048894 | 5/2007 |

OTHER PUBLICATIONS

Bravo-Diaz et al. "Effects of Monovalent and Divalent Anionic Dodecyl Sulfate Surfactants on the Dediazoniation of 2-,3-, and 4-Methylbenzenediazonium Tetrafluoroborate" Langmuir 1998, 14, 5098-5105.*
Hurley et al. "Covalent Bonding of Organic Molecules to Cu and Al Alloy 2024 T3 Surfaces via Diazonium Ion Reduction" Journal of the Electrochemical Society 151 (5) B252-B259.*
Sondag-Huethorst et al. "Generation of Electrochemically Deposited Metal Patterns by Means of Electron Beam (Nano)Lithography of Self-Assembled Monolayer Resists" Appl. Phys. Lett. 64 (3), 285-287.*
Milanesi et al. "(Sensitized) Photolysis of Diazonium Salts as a Mild General Method for the Generation of Aryl Cations. Chemoselectivity of the Singlet and Triplet 4-Substituted Phenyl Cations" J. Org. Chem. 2005, 70, 603-610.*
U.S. Appl. No. 11/835,004, filed Aug. 7, 2007, Mevellec, et al.

* cited by examiner

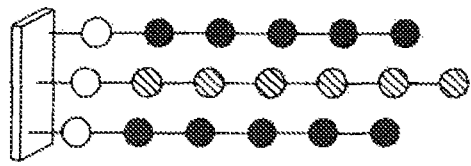
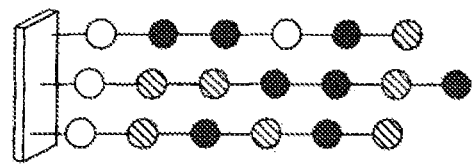
FIG.1a  FIG.1b
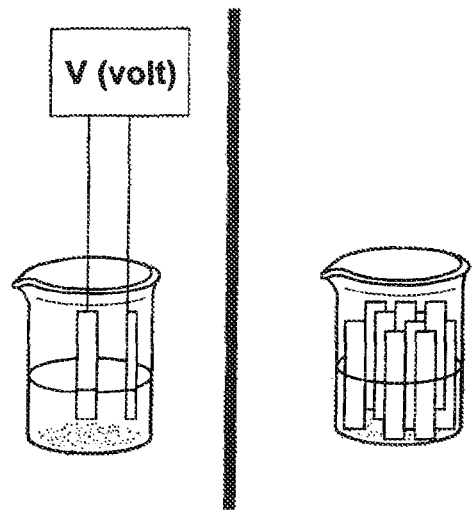
FIG.2a  FIG.2b
PRIOR ART

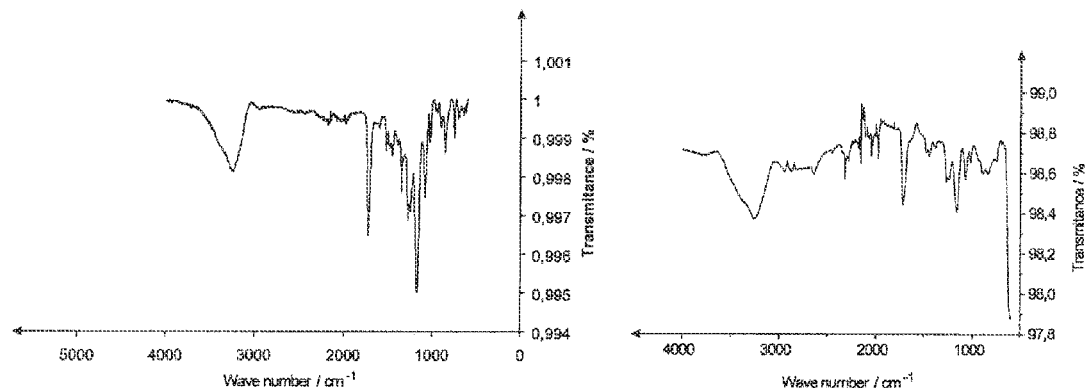
Gold plate
FIG. 12a
Titanium
FIG. 12b
FIG. 13a
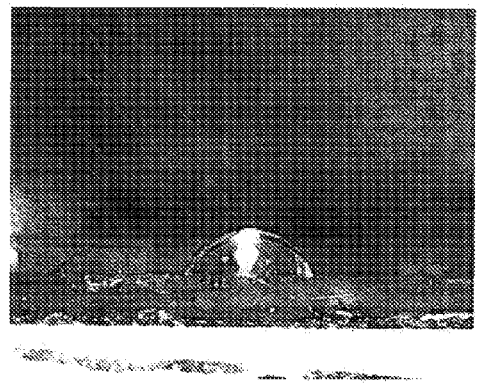
FIG. 13b

METHOD FOR PREPARING AN ORGANIC FILM AT THE SURFACE OF A SOLID SUPPORT UNDER NON-ELECTROCHEMICAL CONDITIONS, SOLID SUPPORT THUS OBTAINED AND PREPARATION KIT

CROSS REFERENCE TO RELATED APPLICATIONS

This patent application is a Continuation-In-Part of U.S. patent application Ser. No. 11/686,076 filed on Mar. 14, 2007 which claims priority to French Application No. 06 55653, filed on Dec. 19, 2006. This application also claims priority to French Application No. 07 54278, filed on Apr. 4, 2007.

TECHNICAL FIELD

This invention relates to the field of organic surface coatings, said coatings being in the form of organic films. It relates more specifically to the use of solutions appropriately selected to allow the simple and reproducible formation of organic films by coating on electrically- or non-electrically-conductive surfaces without using the conventional surface functionalisation techniques. This invention also relates to a method for preparing such organic coatings.

PRIOR ART

There are currently a number of techniques making it possible to produce organic thin films on substrates, each based on a suitable family or class of molecules.

The spin coating method does not require any particular affinity between the molecules deposited and the substrate of interest, which is also true of related techniques for forming coatings by dip coating or by spray coating. Indeed, the cohesion of the deposited film is essentially based on the interactions between the constituents of the film, which can, for example, be cross-linked after deposition so as to improve its stability. These techniques are very versatile, applicable to any type of surface to be covered, and very reproducible. However, they do not allow any effective grafting between the film and the substrate (it involves simple physisorption), and the thickness produced are difficult to estimate in particular for thinnest deposits (less than 20 nanometres). Moreover, the spin coating techniques allow for uniform deposits only when the surface to be coated is essentially planar (U.S. Pat. No. 7,119,030). The quality of the films obtained by spray coating techniques is related to the wetting of the surfaces by the sprayed liquid, since the deposit essentially becomes film-forming only when the drops coalesce. Thus, for a given polymer, there are generally only one or two organic solvents capable of giving satisfactory results in terms of thickness and deposit homogeneity.

Other techniques for forming an organic coating at the surface of a support, such as plasma deposition, described for example in the articles of Konuma M., "Film deposition by plasma techniques", (1992) Springer Verlag, Berlin, and Biederman H. and Osada Y., "Plasma polymerization processes", 1992, Elsevier, Amsterdam or the photochemical initiation are based on the same principle: generating, near the surface to be covered, unstable forms of a precursor, which evolve by forming a film on the substrate. While the plasma deposition requires no particular properties of its precursors, the photo-initiation necessitates the use of photosensitive precursors, the structure of which evolves under light irradiation. These techniques generally give way to the formation of adherent films, although it is usually impossible to discern whether this adhesion is due to a cross-linking of a film topologically closed around the object or to a real formation of bonds at the interface. Unfortunately, these methods require relatively complex and costly pre-treatments, the use of vacuum set-ups for the plasma methods such as plasma-enhanced chemical vapour deposition, irradiation, or the use of potentiostats for the electrochemical methods to which many connection problems are related.

Cataphoresis is a technique that is also suited for the coating of conductive surfaces with organic films. Cataphoresis or cationic electrodeposition makes it possible to coat metal parts using changed polymers and enables uniform films to be provided on conductive surfaces. This method does not apply to non-conductive parts and can be performed only using changed polymers that have already been pre-synthesised. Therefore, there is no growth of films during the use of the cataphoresis, but only deposition on the surface. In addition, the treatment requires the parts to be in direct contact with the cathode, as well as very strict monitoring the cathode bath of parameters, which must be complied with. The electrodeposited layer is insoluble, but lacks physical or chemical resistance, and therefore requires an additional baking step in order to acquire all of these properties. Moreover, this technique is unsuitable for small parts with a complex shape.

The self-assembly of monolayers is a very simple technique to implement (Ulman A., "An introduction to ultrathin organic films from Langmuir-Blodgett films to self-assembly", 1991, Boston, Academic Press). However, this technique requires the use of generally molecular precursors having an adequate affinity for the surface of interest to be coated. Then, there is the precursor-surface pair, such as sulphur compounds having an affinity for gold or silver, tri-halogenosilanes for oxides such as silica or alumina, and polyaromatics for graphite or carbon nanotubes. In each case, the formation of the film is based on a specific chemical reaction between a portion of the molecular precursor (the sulphur atom in the case of thiols, for example) and some "receptor" sites on the surface. A chemisorption reaction ensures the adhesion. Thus, at room temperature and in solution, films of molecular thickness (less than 10 nm) are obtained. However, while the pairs involving oxide surfaces give way to the formation of very solidly grafted films (the Si—O bond involved in the chemisorption of tri-halogenosilanes on silica is among the most stable in chemistry), this is not at all the case when considering metals or semiconductors without oxide. In these cases, the interface bond between the conductive surface and the monomolecular film is fragile. Thus, the self-assembled monolayers of thiols on gold desorb when they are heated to above 60° C., or in the presence of a suitable solvent at room temperature, or when they are placed in contact with an oxidizing or reducing liquid medium. Similarly, the Si—O—Si bonds are fragilised when they are in an aqueous or even a moist medium, in particular under the effect of heat.

The electrografting of polymers is a technique based on the initiation, then electrically induced polymerisation, by chain propagation, of electroactive monomers on the surface of interest acting both as electrode and polymerisation primer (S. Palacin et al., "Molecule-to-metal bonds: electrografting polymers on conducting surfaces.", Chem Phys Chem, 2004, 10, 1468). The electrografting requires the use of precursors suitable for its mechanism of initiation by reduction and propagation, generally anionic because cathodically-initiated electrografting is often preferred, applicable on noble and non-noble metals (unlike the electrografting by anodic polarization, which is applicable only on noble or carbon substrates: graphite, vitreous carbon, boron-doped diamond). The "depleted vinyl" molecules, i.e. bearing electroattractive functional groupings, such as acrylonitriles, acrylates and vinyl-pyridines, are particularly suitable for this method, which allows for numerous applications in the microelectronics or biomedical field. The adherence of these electrografted films is ensured by a carbon-metal covalent bond (G. Deniau et al., "Carbon-to-metal bonds: electroreduction of 2-butenenitrile" Surf. Sci. 2006, 600, 675).

According to this electrografting technique, polymerisation is indispensable to the formation of the carbon/metal interface bond: it was indeed shown (G. Deniau et al., "Coupled chemistry revisited in the tentative cathodic electropolymerization of 2-butenenitrile.", Journal of Electroanalytical Chemistry, 1998, 451, 145-161) that the electrografting mechanism involves an electro-reduction of the monomer in the immediate vicinity of the surface, to yield an unstable anion radical capable of being covalently grafted by its radical termination on the electrode. The grafted anion thus obtained, if it was not in the immediate vicinity of the polymerisable molecules, would desorb and return to the solution (G. Deniau et al., "Coupled chemistry revisited in the tentative cathodic electropolymerization of 2-butenenitrile.", Journal of Electroanalytical Chemistry, 1998, 451, 145-161). In competition with this desorption reaction, the addition reaction (Michael addition) of the charge of the first anion chemisorbed on a free monomer provides a second means of stabilising the reaction intermediary: the product of this addition again yields a grafted anion, where the charge is, however, "away" from the surface, which contributes to the stabilisation of the adsorbed structure. This dimer anion can itself again be added to a free monomer, and so on, each new addition providing additional stability by relaxing the polarised surface/charge repulsion, which means that the bonding interface of the first anion radical, which is temporary, becomes stable to the extent that polymerisation occurs.

Among the various techniques mentioned above, electrografting is the only technique that makes it possible to produce grafted films with a specific control of the bonding interface. Indeed, the only technique making it possible to graft polymer films resulting from vinyl monomers activated on surfaces, which are necessarily conductive, consists of electrically initiating the polymerisation reaction from the surface via a potentiostat, followed by a growth of chains, monomer-by-monomer, requiring the use of an electrochemical cell with a cathode and an anode, as well as an application of a voltage at the terminals thereof.

Belanger et al. (J. Electroanal. Chem. 1998, 455, 75) described the grafting of diazonium salts synthesized in situ in the aqueous acid phase by electrochemical initiation. The international patent application WO 03 018212 describes, in particular, a method for grafting and growing an organic conductive film on an electrically conductive surface, the grafting and the growth being performed simultaneously by electroreduction of a diazonium salt that is a precursor of said organic film.

However, no technical solution has been proposed for producing organic coatings grafted on any type of surface, in non-electrochemical conditions and without any particular pre-treatment technique.

DESCRIPTION OF THE INVENTION

This invention makes it possible to solve the disadvantages of the prior art methods and coatings, and differs from the latter in that it makes it possible to perform the grafting of organic polymer or copolymer films in the absence of an electric voltage. The method proposed thus makes it possible to graft films onto surfaces of various types, and its application is not limited to electrically conductive or semiconductive surfaces.

This invention therefore relates to a method for preparing an organic film at the surface of a solid support, characterised in that it includes a step of contacting said surface with a liquid solution comprising:
  at least one protic solvent,
  at least one adhesion primer,
  at least one radically polymerisable monomer, said monomer being different from the adhesion primer,
under non-electrochemical conditions, and enabling the formation of radical entities based on the adhesion primer.

In the sense of this invention, by "organic film", we mean any polymer or copolymer film, resulting from a plurality of monomer units of identical or different chemical species and adhesion primer molecules. The films obtained by the method of this invention are "essentially" of the polymer type insofar as the film also incorporates species resulting from the adhesion primer and not only the monomers present. An organic film in the context of this invention is in particular a film prepared from at least one type of polymerisable monomer, particularly radically polymerisable, and at least one type of adhesion primer. The organic film in the context of this invention advantageously has a monomer unit sequence in which the first unit is constituted by a derivative of the adhesion primer, and the other units are indifferently derived from adhesion primers and polymerisable monomers.

By "protic solvent", we mean, in the context of this invention, a solvent that comprise at least one hydrogen atom capable of being released in proton form.

The protic solvent is advantageously chosen from the group constituted by water, deionised water, distilled water, acidified or not, acetic acids, hydroxylated solvents such as methanol and ethanol, low-molecular-weight liquid glycols such as ethyleneglycol, and their mixtures. In a first alternative, the protic solvent used in the context of this invention is constituted only by a protic solvent or by a mixture of various protic solvents. In another alternative, the protic solvent or the mixture of protic solvents can be used in a mixture with at least one aprotic solvent, provided that the resulting mixture has the characteristics of a protic solvent. Acidified water is the preferred protic solvent and, more specifically, distilled or deionised acidified water.

The term "adhesion primer", in the context of this invention, refers to any organic molecule capable, under certain conditions, of being chemisorbed at the surface of a solid support by a radical reaction such as radical chemical grafting, and comprising a reactive function with respect to another radical after chemisorption.

The term "radical chemical grafting" refers in particular to the use of molecular entities having a non-paired electron for forming covalent bonds with a surface of interest, said molecular entities being generated independently of the surface on which they are intended to be grafted. Thus, the radical reaction leads to the formation of covalent bonds between the surface concerned and the derivative of the grafted adhesion primer.

By "derivative of the adhesion primer", we mean, in the context of this invention, a chemical unit resulting from the adhesion primer, after the latter has reacted by radical chemical grafting, in particular with the surface of the solid support implemented in the context of this invention. It is clear for a person skilled in the art that the reactive function with respect to another radical after chemisorption of the derivative of the adhesion primer is different from the function involved in the covalent bond with the surface of the solid support.

The adhesion primer is advantageously a cleavable aryl salt chosen from the group constituted by aryl diazonium salts, aryl ammonium salts, aryl phosphonium salts and aryl sulfonium salts. In these salts, the aryl group is an aryl group that can be represented by R as defined below.

Among the cleavable aryl salts, the compounds of the following formula (I) can be cited in particular:

  (I)

in which:
A represents a monovalent anion, and,
R represents an aryl group.

As the aryl group of the cleavable aryl salts, and in particular of the above-mentioned compounds of formula (I), we can advantageously cite aromatic or heteroaromatic carbon structures, possibly mono- or polysubstituted, constituted by one or more aromatic or heteroaromatic cycles each comprising 3 to 8 atoms, the heteroatom(s) being N, O, P or S. The substituent(s) can contain one or more heteroatoms, such as N, O, F, Cl, P, Si, Br or S as well as alkyl groups in $C_1$ to $C_6$, in particular.

Within the cleavable aryl salts, and in particular the above-mentioned compounds of formula (I), R is preferably chosen from the aryl groups substituted by electron-attracting groups such as $NO_2$, COH, ketones, CN, $CO_2H$, $NH_2$, esters and halogens. The aryl-type R groups especially preferred are the nitrophenyl and phenyl radicals.

Within the above-mentioned compounds of formula (I), A can in particular be chosen from inorganic anions such as halides, for example $I^-$, $Br^-$ and $Cl^-$, halogen borates such as tetrafluoroborate and organic anions such as alcoholates, carboxylates, perchlorates and sulfonates.

As compounds of formula (I), it is particularly advantageous to use a compound chosen from the group constituted by phenyldiazonium tetrafluoroborate, 4-nitrophenyldiazonium tetrafluoroborate, 4-bromophenyldiazonium tetrafluoroborate, 4-aminophenyldiazonium chloride, 2-methyl-4-chlorophenyldiazonium chloride, 4-benzoylbenzenediazonium tetrafluoroborate, 4-cyanophenyldiazonium tetrafluoroborate, 4-carboxyphenyldiazonium tetrafluoroborate, 4-acetamidophenyldiazonium tetrafluoroborate, 4-phenylacetic acid diazonium tetrafluoroborate, 2-methyl-4-[(2-methylphenyl)diazenyl]benzenediazonium sulphate, 9,10-dioxo-9,10-dihydro-1-anthracenediazonium chloride, 4-nitronaphthalenediazonium tetrafluoroborate and naphthalenediazonium tetrafluoroborate.

It is preferable for the adhesion primer to be soluble in the protic solvent used. In the sense of the invention, an adhesion primer is considered to be soluble in a given solvent if it remains soluble until reaching a concentration of 0.5 M, i.e. the solubility is at least equal to 0.5 M under normal conditions of temperature and pressure (NTP). Solubility is defined as the analytical composition of a saturated solution, expressed in terms of the proportion of a given solute in a given solvent; it can be expressed in particular in molarity. A solvent containing a given concentration of a compound will be considered to be saturated, when the concentration is equal to the solubility of the compound in this solvent. The solubility can be finite or infinite. In the latter case, the compound is soluble in any proportion in the considered solvent.

The amount of adhesion primer present in the solution used, according to the method of the invention, can vary as desired by the experimenter. This amount is related in particular to the desired thickness of the organic film as well as the amount of adhesion primer that can possibly and reasonably be integrated in the film. Thus, to obtain a film grafted on the entire surface of the solid support in contact with the solution, it is necessary to use a minimum amount of adhesion primer, which can be estimated by molecular size calculations. According to a particularly advantageous embodiment of the invention, the adhesion primer concentration in the liquid solution is between around $10^{-6}$ and 5 M, and preferably between $10^{-2}$ and $10^{-1}$ M. A so-called "primer" layer is formed when the surface is coated with at least one film of monomolecular thickness derived from the adhesion primer and in particular derived from diazonium. It is of course possible to use any means of analysis to test the presence of the primer layer and determine its thickness; such means can in particular be infrared spectrometry (IR) measurements or X photoelectron spectroscopy (XPS) and ultraviolet (UV) measurements depending on the atoms and chemical groups present on the adhesion primer used.

Advantageously, if the adhesion primer is an aryl diazonium salt, the pH of the solution is less than 7, typically less than or equal to 3. It is recommended to work with a pH between 0 and 3. If necessary, the pH of the solution can be adjusted to the desired value using one or more acidifying agents well known to a person skilled in the art, for example using organic or mineral acids such as hydrochloric acid, sulphuric acid, and so on.

The adhesion primer can either be introduced in the liquid solution as defined above, or be prepared in situ in the latter. Thus, in a particular embodiment, the method according to this invention comprises a step of preparing the adhesion primer, in particular when it is an aryl diazonium salt. Such compounds are generally prepared from arylamines, which may comprise a plurality of amine substituents, by reaction with $NaNO_2$ in an acidic medium. For a detailed description of the experimental modes that can be used for such an in situ preparation, a person skilled in the art can refer to the open literature [D. Belanger et al. Chem. Mater. 18 (2006) 4755-4763]. The grafting will then preferably be performed directly in the solution for preparation of the aryl diazonium salt.

The radically polymerisable monomers implemented in the context of this invention correspond to monomers capable of polymerising under radical conditions after initiation by a radical chemical entity. Typically, it involves molecules comprising at least one ethylene-type bond. The vinyl monomers, in particular the monomers described in the patent application FR 05 02516 as well as in patent FR 03 11491, are particularly concerned.

According to a particularly advantageous embodiment of the invention, the vinyl monomer(s) is(are) chosen from the monomers of the following formula (II):

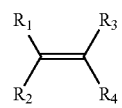  (II)

in which the $R_1$ to $R_4$ groups, identical or different, represent a non-metallic monovalent atom such as a halogen atom, a hydrogen atom, a saturated or unsaturated chemical group, such as an alkyl or aryl group, a $-COOR_5$ group in which $R_5$ represents a hydrogen atom or an alkyl group in $C_1$-$C_{12}$ and preferably $C_1$-$C_6$, a nitrile, a carbonyl, an amine or an amide.

The above-mentioned compounds of formula (II) are in particular chosen from the group constituted by vinyl acetate, acrylonitrile, methacrylonitrile, methyl methacrylate, ethyl methacrylate, butyl methacrylate, propyl methacrylate, hydroxyethyl methacrylate, hydroxypropyl methacrylate, glycidyl methacrylate and their derivatives; the acrylamides and in particular the aminoethyl, propyl, butyl, pentyl and hexyl acrylamides and in particular methacrylamides, the cyanoacrylates, the di-acrylates and di-methacrylates, the tri-acrylates and tri-methacrylates, the tetra-acrylates and tetra-methacrylates (such as tetramethacrylate pentaerythritol), styrene and its derivatives, parachloro-styrene, pentafluoro-styrene, N-vinyl pyrrolidone, 4-vinyl pyridine, 2-vinyl pyridine, the vinyl halides, acryloyl or methacryloyl, di-vinylbenzene (DVB), and more generally the vinyl cross-linking agents based on acrylate, methacrylate and their derivatives.

According to a specific embodiment, the monomers used are those that, unlike the components that are soluble in any proportion in the solvent considered, are soluble only to a certain proportion in the solvent, i.e. the value of their solubility in said solvent is finite. The monomers that can be used in accordance with the method of the invention can thus be chosen from the compounds of which the solubility in the protic solvent is finite, and more specifically less than 0.1 M, more preferably between $5.10^{-2}$ and $10^{-6}$ M. Among such monomers, it is possible, for example, to cite butyl methacrylate of which the solubility, measured under normal conditions of temperature and pressure, is around $4.10^{-2}$ M. According to the invention, and unless otherwise indicated, the normal conditions of temperature and pressure (NTP) correspond to a temperature of 25° C. and to a pressure of $1.10^5$ Pa.

The invention also applies to a mixture of two, three, four or more monomers chosen from the monomers described above.

The amount of polymerisable monomers in the solution may vary as desired by the experimenter. This amount can be greater than the solubility of the monomer considered in the protic solvent used, and can be, for example, 18 to 40 times the solubility of said monomer in the solution at a given temperature, generally room temperature or the temperature of the reaction. Under these conditions, it is advantageous to use means allowing for the dispersion of the monomer molecules in the solution, such as a surfactant or ultrasound.

According to a specific embodiment of the invention, it is recommended to add a surfactant when the monomer has a solubility of less than $5.10^{-2}$ M. A precise description of the surfactants that can be used in the context of the invention is provided in patent applications U.S. Ser. No. 11/364,360 and FR 06 08945, to which a person skilled in the art can refer. A single surfactant or a mixture of a plurality of surfactants can be used. The amount of surfactant(s) necessary is variable; it must in particular be enough to allow for the formation of the organic film. The minimum amount of surfactant(s) can easily be determined by sampling solutions with identical compositions but variable surfactant concentrations. In general, the surfactant concentration is such that the critical micellar concentration (CMC) is reached and the formation of micelles can thus take place. The CMC of a surfactant can be determined by methods known to a person skilled in the art, for example, by measuring surface tensions.

According to another embodiment of the invention, it is possible to use ultrasound to promote the solubilisation of the monomer or to form a dispersion when the monomer is insoluble in the medium [R. Asami et al. Langmuir B, 2006, 22, 10258].

According to the provisions presented, the solubility of the monomer appears not to be an obstacle to the method owing to the use of technical means, such as vigorous agitation, which can be induced by ultrasound, which allow for the formation of a dispersion and/or an emulsion, for the liquid monomer(s). If the polymerisable monomer(s) does not have an affinity for the protic solvent used, such as non-water soluble monomers, it is therefore advantageous for the solution to be in the form of an emulsion or a dispersion.

In an alternative, the method according to this invention includes a preliminary step in which the polymerisable monomer or the mixture of polymerisable monomers is dispersed or emulsified in the presence of at least one surfactant, or by ultrasound, before its mixture with the liquid solution including at least one protic solvent and at least one adhesion primer.

By "non-electrochemical conditions", we mean, in the context of this invention, in the absence of electric voltage. The non-electrochemical conditions allowing for the formation of radical entities are numerous, and this type of reaction is known and studied in detail in the prior art (Rempp & Merrill, Polymer Synthesis, 1991, 65-86, Hüthig & Wepf).

It is thus possible, for example, to adjust the thermal, kinetic, chemical, photochemical or radiochemical environment of the adhesion primer so as to destabilise it so that it will form a radical entity. It is of course possible to simultaneously adjust a plurality of these parameters.

The thermal environment is based on the temperature of the solution. It is easy to control using heating methods normally used by a person skilled in the art. The use of a thermostatically controlled environment is of particular interest when it allows for precise control of the reaction conditions.

The kinetic environment corresponds essentially to the agitation within the solution. In this case, it is not the agitation of molecules in itself (elongation of bonds, etc.), but the overall movement of the molecules within the solution. Vigorous agitation, for example using a magnetic stirring bar or ultrasound, makes it possible in particular to provide kinetic energy in the solution and thus destabilise the adhesion primer so that it forms radicals.

Finally, the action of various types of radiation, such as electromagnetic radiation, γ radiation, UV rays, or electron or ion beams can also adequately destabilise the adhesion primer so that it forms radicals. The wavelength used will be dependent on the primer used, for example 306 nm for 4-hexylbenzenediazonium.

In the context of this invention, the non-electrochemical conditions allowing for the formation of radical entities are typically chosen from the group constituted by thermal, kinetic, photochemical, or radiochemical conditions and combinations thereof. Advantageously, the non-electrochemical conditions allowing for the formation of radical entities are chosen from the group constituted by thermal, chemical, photochemical or radiochemical conditions and combinations thereof with one another and/or with kinetic conditions. The non-electrochemical conditions are more specifically chemical conditions.

In the context of chemical conditions, it is envisaged to add one or more chemical initiator to the liquid solution as defined above. Indeed, it is also possible to adjust the chemical environment of the adhesion primer by adding one or more chemical initiator to the liquid solution. The presence of chemical initiator is often combined with non-chemical environmental conditions, as mentioned above. Typically, a chemical initiator of which the stability is lower than that of the adhesion primer under the chosen environmental conditions will evolve in an unstable form, which will act on the adhesion primer and cause the formation of a radical entity based on the latter. It is also possible to use chemical initiator of which the action is not essentially related to the environmental conditions, and which are efficient on a wide range of thermal or kinetic conditions, for example.

There are numerous chemical initiators for radical polymerisation. Three major types can be distinguished on the basis of the environmental conditions used:

thermal initiators, the most common of which are peroxides or azo compounds. Under the effect of heat, these compounds dissociate into free radicals; in this case, the reaction is performed at a minimum temperature corresponding to that necessary for the formation of radicals based on the initiator. This type of chemical initiator is generally used specifically within a certain temperature interval, according to their decomposition kinetics;

photochemical or radiochemical initiators, which are excited by the radiation triggered by irradiation (usually UV, but also γ radiation or electron beams) allow for the production of radicals by more or less complex mechanisms. $Bu_3SnH$ and $I_2$ belong to photochemical or radiochemical initiators;

essentially chemical primers, which act rapidly and under normal conditions or temperature and pressure on the adhesion primer so as to allow it to form radicals. Such initiators generally have an oxidation reduction potential that is less than the reduction potential of the adhesion primer used under the reaction conditions. Depending on the type of initiator, it can thus be a metal, generally in a finely divided form or metal filings, reductive, such as iron, zinc, nickel or have an organic or inorganic base in proportions sufficient to allow for destabilisation of the adhesion primer; a pH greater than or equal to 4 is generally sufficient.

Among the primers capable of being used in the context of the invention, it is possible in particular to cite halogenated initiators such as iodine, α-halogenoalkyls having aryl, allyl, carbonyl or sulfonyl groups, polyhalogenated compounds such as $CCl_4$ or $CHCl_3$, compounds having highly-labile covalent bonds with halogens and generally corresponding to bonds established between a heteroatom, such as N, S or O, and a halogen, potassium persulfate ($K_2S_2O_8$), azobis(isobutyronitrile), peroxidated compounds such as benzoyl peroxide, tert-butyl peroxide, cumyl peroxide, tert-butyl perbenzoate, tert-butyl hydroperoxide, and finely-divided reductive metals such as iron, zinc, nickel, preferably in the form of filings or fine particles.

The amount of initiator will be chosen according to the process conditions used. Generally, the amounts are between 5 and 20% mass of monomers, and typically around 10%. Thus, for example, when the adhesion primer is an aryl diazonium salt, it is possible to use, as the initiator, iron filings, of which the diameter of the particles is between 50 and 250 µm. Alternatively, it is possible to use basic conditions so that the pH of the solution is high enough to cause destabilisation of the adhesion primer in the form of radicals.

The method is generally carried out under gentle and non-destructive conditions either for the surface of the sample on which the film is to be grafted, or for the monomer used. Thus, it is desirable to work under conditions in which the monomer does not deteriorate. In addition, the temperature of the reaction medium is limited by the protic solvent, which is preferably preserved in liquid form. The method is carried out between 0 and 100° C. and generally under normal conditions of temperature and pressure (NTP), depending on where the user is, often at around 25° C. at a pressure of around 1 atm.

The reaction time can be adjusted. Indeed, the adjustment of the time of exposure of the surface of the solid support to the solution makes it possible to vary the thickness of the film that is obtained. It is of course possible for the same type of surface to precisely calibrate the process conditions that the user considers to be optimal. The analysis means described in the examples below are particularly suitable for determining in particular the thickness of the film, its composition and, incidentally, the reaction time. It is, for example, possible to obtain films of which the thickness is between 2 nm and 200 nm causing the reaction time to vary between 1 and 15 minutes, for a monomer concentration of $5.10^{-2}$ M and a diazonium salt concentration of 0.8 M.

In a first alternative of the method according to the invention, said method can include the following steps, consisting of:

a) adding at least one monomer to a solution containing at least one adhesion primer different from said monomer in the presence of at least one protic solvent and optionally at least one chemical initiator, b) placing the solution obtained in step (a) under non-electrochemical conditions allowing for the formation of radical entities based on the adhesion primer and possibly based on the chemical initiator, c) placing the surface of the solid support in contact with the solution of step (b).

In a second alternative of the method according to the invention, the latter can include the following steps, consisting of:

a') placing the surface of the solid support in contact with a solution containing at least one adhesion primer in the presence of at least one protic solvent, and possibly at least one chemical initiator and at least one monomer, b') placing the surface of the solid support in contact with the solution of step (a') under non-electrochemical conditions allowing for the formation of radical entities based on the adhesion primer and possibly based on the chemical initiator, c') possibly adding at least one monomer to the solution obtained in step (b').

In the second alternative of the method as defined above, it is possible to envisage the following three cases:

i. the monomers are not present in the solution of step (a') and are added only in step (c'). This case is particularly advantageous when the monomer used is relatively insoluble and in particular in an aqueous solution; when the monomer is non-water-soluble and the adhesion primer is diazonium salt. Thus, in step (c'), the monomer can be added to the solution in particular in the same solvent as that used in step (a') and advantageously in the form of an emulsion or a dispersion produced previously using ultrasound or surfactants.

ii. the monomers are present in the solution of step (a') and the method does not have a step (c'). This case applies in particular when the primer is a diazonium salt and when the monomer is water-soluble. The method according to the first alternative can also be used in this case.

iii. one portion of the monomers is present in the solution of step (a') and another portion of the monomers of the same or of a different type is added only in step (c').

As explained above, in the various alternatives of the method, which is the subject matter of this invention, the adhesion primer can be introduced either to the solution, or prepared in situ in the solution.

The method according to this invention advantageously comprises an additional step, prior to the grafting, of cleaning the surface on which the organic film is to be formed, in particular by brushing and/or polishing; an additional ultrasound treatment with an organic solvent such as ethanol, acetone or dimethylformamide (DMF) is even recommended.

According to specific provisions, it is possible to produce, using the method of this invention, organic films essentially of the statistical or sequential polymer type.

To prepare a sequential film, it is sufficient to prepare, as described above, a layer of a first polymer on the surface of a solid support, then to re-start the experiment by changing the type of the monomer in solution. It is thus possible to iteratively produce a alternate film of high quality (FIG. 1a). During each of the successive steps, the adhesion primer will be grafted on the surface at its contact and will allow for the growth of a film based on the monomer or monomers present in the solution. Between each of the grafting sequences, it is entirely possible to perform a cleaning of the surface obtained.

To obtain a statistical copolymer (FIG. 1b), it is sufficient to use monomers of different types in the solution. The exact composition of the film is, in this case, based on the reactivity of each of the monomers present.

The thickness of the film is easy to estimate according to the method of this invention, as explained above. For each of the parameters, and on the basis of each of the reagents used, a person skilled in the art will be capable of iteratively determining the optimum conditions for obtaining a film of variable thickness. It is also useful to refer to the examples showing the invention and demonstrating that it is possible, for example, to produce films of which the thickness is between several nanometres and several hundred nanometres.

The solid support of which the surface is treated according to the method of the invention can be of any type. Indeed, it is at the surface of the sample in contact with the solution that the radical grafting reaction will take place. Thus, the surface of the solid support to be prepared in accordance with the method according to this invention must have at least one atom capable of being involved in a radical reaction. The solid support can be electrically conductive or non-conductive. The solid support can have a more or less large surface and a variable roughness. The method is applicable to samples of nanometric or metric size. Thus, for example, the method can be applied to surfaces of nano-objects such as nanoparticles or nanotubes, typically carbon, or to more complex devices.

The invention is applicable to a wide variety of surfaces of interest, of which the composition may be chosen from a wide variety of materials. Indeed, the method uses grafting of a purely radical type, and does not require the surface to have specific limiting characteristics such as high conductivity. Thus, the surface can be organic or non-organic, and can also be of a composite nature and have a non-uniform composition. Any surface having one or more atom(s) or atom group (s) capable of being involved in a radical addition or substitution reaction, such as CH, C=C, carbonyls (ketone, ester, acid, aldehyde), OH, ethers, amines, or halogens, such as F, Cl and Br, is concerned by this invention.

The solid support can have an inorganic surface that can be chosen from conductive materials such as metals, noble metals, oxidized metals, transition metals, metal alloys and, for example, Ni, Zn, Au, Pt, Ti, and steel. The inorganic surface can also be chosen from semiconductive materials such as Si, SiC, AsGa, Ga, and so on. It is also possible to apply the method to solid supports having a non-conductive surface such as non-conductive oxides such as $SiO_2$, $Al_2O_3$ and MgO. More generally, the inorganic surface of the solid support can be constituted, for example, by an amorphous material such as glass generally containing silicates or even ceramic.

The solid support can have an organic surface. As an organic surface, it is possible to cite natural polymers, such as latex or rubber, or artificial polymers such as derivatives of polyamide or polyethylene, and in particular polymers having n-type bonds such as polymers with ethylene bonds, carbonyl groupings and imine. It is also possible to apply the method to more complex organic surfaces, such as surfaces including polysaccharides, such as cellulose for wood or paper, artificial or natural fibres, such as cotton or felt, or fluoro-polymers such as polytetrafluoroethylene (PTFE).

The solid support and/or the surface of the solid support implemented in the context of this invention are advantageously made of a material chosen from the group constituted by metals, wood, paper, cotton, felt, silicon, carbon nanotubes and fluoro-polymers.

According to a specific embodiment, the surface of the solid support on which the organic film is to be formed is equipped with a mask that covers it at least partially and that insulates it from the liquid solution. The mask typically corresponds to a physical entity that is neither grafted to the surface nor covalently bonded thereto. It can in particular be a bulk material or a thin film of material, typically several angstrom to several microns, generally organic, deposited on the surface.

The mask makes it possible to locally "protect" the chemical reactivity of the surface with regard to the radicals generated during the process and thus leads to the controlled formation of a film solely on the portions of the surface exposed to the solution, with the areas of the surface of the support equipped with the mask being protected from the formation of the organic film. The surface of the solid support contacted with the liquid solution as defined above thus typically comprises at least one area covered with a mask. After removal of the mask at the end of the operation, the surface that was protected, unlike the surface that was not equipped with a mask, does not comprise a grafted film.

The mask will preferably be constituted by a thin layer of inorganic or organic material acting as a layer of lower cohesion that can easily be removed under gentle conditions. A layer of material is considered as such insofar as it does not require the use of extreme conditions detrimental to the grafted film. Typically, the gentle conditions correspond to a simple chemical wash, generally performed with a solvent, an ultrasound treatment in a solvent or an increase in temperature. It is of course desirable for the mask not to be soluble in the protic solvent present in the liquid solution, i.e. used in the grafting reaction. Thus, it is recommended to use a mask that has a higher affinity for the surface than it has for the reaction solvent.

The material constituting the mask can thus be chosen from a wide range of materials. It will generally be chosen according to the nature of the solid support.

The mask can react with the radicals generated during the process. In every case, it is possible to remove it so as to expose the areas of the solid support surface protected from the grafting on which no organic film will be observed (similar to the so-called "lift-off" methods in lithography).

The mask deposition techniques are known to a person skilled in the art. They can involve, in particular, coating, vapour deposition or immersion. Thus, the mask, in the form of a thin layer of material, can be deposited, for example, by direct drawing with a felt (pencil-type) pen impregnated with the chosen material. On glass, it is possible, for example, to use, as a mask, a marker such as those provided for paper, or else fats. It is also possible to use the so-called microcontact printing method. This technique can be applied in particular if the surface of the solid support has a strong affinity for sulphur atoms, such as a gold surface. In this case the mask will generally be composed of alkylthiols, in particular long-chain alkylthiols, often at C15-C20 and typically at C18. More generally, the classic lithography techniques can be used to form the mask: spin-coating, then insolation through a physical mask or via a light beam or controllable particles, then exposure.

This invention also relates to a, non-electrically-conductive solid support on which an organic film is grafted, of which the first unit covalently bound to said non-electrically-conductive support is a derivative of an adhesion primer. The non-electrically conductive solid support according to this invention can possibly have a mask as defined above.

The organic film advantageously includes, in addition to the first unit covalently bound to the non-electrically-conductive support derived from an adhesion primer, monomers of the same or different type bound to one another by a radical reaction, and possibly derivatives of the adhesion primer. Thus, as explained above, the organic film is essentially a polymer film. More specifically, it can be in the form of a sequential polymer film or a statistical copolymer film. The non-electrically-conductive solid supports, the adhesion primers and the monomers are as defined above.

This invention also relates to the use of a solution containing at least one protic solvent, at least one adhesion primer, at least one monomer different from the adhesion primer and, possibly, at least one chemical initiator as defined above, to form, under non-electrochemical conditions allowing for the formation of at least one radical on the adhesion primer, an organic film at the surface of a solid support in contact with said solution.

The invention also relates to a kit for preparing a polymeric organic film at the surface of a sample. Such a kit includes, in particular:

in a first compartment, a solution containing at least one adhesion primer as defined above, in a second compartment, a solution containing at least one radically polymerisable monomer different from the adhesion primer as defined above, and, possibly, in a third compartment, a solution containing at least one chemical polymerisation initiator as defined above.

In an alternative of the kit according to the invention, the first compartment contains at least one precursor of an adhesion primer. By "precursor of an adhesion primer", we mean a molecular separated from the initiator by a single process step that is easy to implement. In this case, the kit will possibly include at least one other compartment containing at least one element necessary for developing the primer from its precursor (third compartment or fourth compartment if a chemical primer is present). Thus, the kit can, for example, contain a solution of an arylamine, precursor of the adhesion primer, and also a $NaNO_2$ solution to allow, by addition, the formation of an aryl diazonium salt, the latter being an adhesion primer. A person skilled in the art will understand that the use of a precursor makes it possible to avoid storing or transporting reactive chemical species.

The protic solvent can be contained in any one of the solutions of the first and second compartments, and possibly in the solution of the third or the fourth compartment. An identical or different protic solvent is advantageously contained in each of the solutions of the first and second compartments, and possibly in the solution of the third or the fourth compartment.

The solutions of the various compartments can of course contain various other identical or different agents, such as stabilising agents or surfactants. The use of the kit is simple, since it is simply necessary to place the sample, of which the surface is to be treated, in contact with the mixture of the solutions prepared extemporaneously by mixing the solutions of the different compartments, preferably by agitation and in particular by ultrasound. Advantageously, only the solution containing the monomer, i.e. of the second compartment, is subjected to ultrasound before being mixed with the solution containing the adhesion primer prepared extemporaneously from a precursor, or present in the solution of the first compartment.

The invention also makes it possible to obtain polymer films having remarkable properties. It should first be noted that the films have a particularly good resistance since, after a step of washing with a solvent in which the monomer is particularly soluble and in the presence of ultrasound, the thickness of the film does not vary significantly. Moreover, it is possible to test, with remarkable success, the thickness of the film obtained by varying the experimental parameters such as the reaction time or the active species concentration. The composition of the films is also homogeneous, and it is possible to test it with great precision, which makes it possible to produce both random and sequential polymer films (also called block or alternate). The films are uniform, i.e. they have a homogenous surface over the entire surface on which the method has been applied. This invention therefore makes it possible to produce numerous functionalisations on a very wide variety of surfaces with different monomers that may be combined with one another.

The invention has numerous advantages. This method makes it possible, using a single, simple and reproducible process, to carry out the grafting of conductive or non-conductive surfaces. The implementation of this method does not require any significant investment with regard to specific equipment such as potentiostats, costly vacuum set-ups, and so on. Moreover, the implementation of the method is simple and fast by comparison with the other techniques known today for grafting or coating surfaces. This method does not require a connection to an electric circuit, unlike electrochemistry, and thus enables it to be applied on surfaces that are difficult to connect, such as nano objects. Furthermore, this radical polymerisation can be performed in the presence of oxygen, and does not involve any special precautions during the synthesis.

As shown diagrammatically in FIG. 2, this invention can be used in an aqueous medium without any equipment other than a container in which the reaction takes place. Therefore, it is no longer necessary to connect the surface to be grafted to a potentiostat (FIG. 2a), but only to soak it in the solution of the reaction medium (FIG. 2b). This technique makes it possible to synthesise a large number of polymers, the monomers of which may or may not be soluble in an aqueous medium, on a very wide variety of electrically- or non-electrically-conductive surfaces with very strong cohesion, with the films obtained being resistant to ultrasound in various solvents.

The invention thus makes it possible to very effectively functionalise a considerable number of surfaces of various types, heretofore not decorated or grafted, such as a PTFE surface. There are numerous fields of application and such a method can be applied, for example, in biology, in particular for biocompatibility processes (stent coating), for the functionalisation and in particular the protection of surfaces, such as metals (anticorrosion) or fibres (water-repellent), for effluent treatments by coating films with complexing molecules, or for producing a structural bond from the grafted film.

In addition, the functionalisation can be localised by using the mask. It is thus possible to specifically coat various areas of the same surface while protecting other areas with one or more masks. This type of procedure is easy to implement because organic masks that are easy to remove can be used. In particular, it is possible to use simple depositions using ink-impregnated felt pens or a coating with fat.

The method according to the invention can also be implemented in a pollution-free approach, since it can be performed in an aqueous medium and it produces little waste, with one of the products of the reaction capable of being in particular dinitrogen.

Other features and advantages of this invention will become clear to a person skilled in the art on reading the following non-limiting examples provided for the purpose of illustration in reference to the appended figures.

BRIEF DESCRIPTION OF THE DRAWINGS

FIG. 1 provides a diagrammatic representation of a sequential film (FIG. 1a) and a statistical film (FIG. 1b) prepared according to this invention.

FIG. 2 provides a diagrammatic representation of the grafting methods of the prior art (FIG. 2a) and of the method according to this invention (FIG. 2b).

FIG. 12 shows the IR spectra obtained for a gold plate (FIG. 12a) and a titanium plate (FIG. 12b) treated identically according to the method of this invention, i.e. based on 2-hydroxyethylmethacrylate and a diazonium salt prepared in situ, in the presence of iron filings.

FIG. 13 shows the photograph of a water drop on a pristine glass plate (FIG. 13a) and the photograph of a water drop on the same glass plate coated with p-butylmethacrylate (p-BuMA) according to the method of the invention (FIG. 13b).

DETAILED DESCRIPTION OF SPECIFIC EMBODIMENTS

The following examples were performed in a glass cell. Unless otherwise indicated, they were conducted under normal conditions of temperature and pressure (around 25° C. under around 1 atm) in ambient air. Unless otherwise indicated, the reagents used were obtained directly on the market without any additional purification. The glass plates used had a surface of 1 cm$^2$.

No precaution was taken with regard to the composition of the atmosphere, and the solutions were not degassed. When the reaction time is not specified, the exposure of the surface to be treated with the reagent solution lasted for 1 to 15 minutes.

EXAMPLE 1

Preparation of a Film on a Gold Plate Using a Diazonium Salt Prepared In Situ and 2-hydroxyethylmethacrylate (HEMA) in the Presence of Iron Filings 4 ml of a solution of $NaNO_2$ at 0.1 M in water were added to 4 ml of a solution of p-phenylenediamine at 0.1 M in HCl (0.5 M), in order to form the aminophenyl mono diazonium salt. 1 ml of HEMA, then 200 mg of iron filings were added to this diazonium salt solution. A gold plate was then added to the reaction medium for 15 min. The plate was then rinsed in water with acetone, and subjected to ultrasound in DMF and then in water before being dried.

Figure 3:
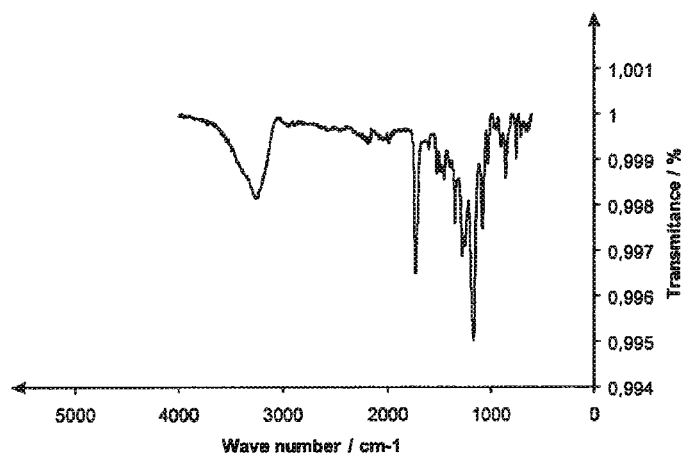
FIG. 3 shows the IR spectrum of a gold plate treated according to an alternative of the method of this invention, i.e. with a solution of which the diazonium salt has been prepared in situ.

The XPS spectrometry (X photoelectron spectroscopy) and IR analyses confirm the presence of the film expected, of which the thickness increases with the reaction time. FIG. 3 shows the IR spectrum of a plate after the treatment.

Table 1 provided below combines a set of thickness values obtained for the same reagents when their concentrations, the exposure time or the amount of filings were varied.

TABLE 1

| HEMA (mol · l$^{-1}$) | Diazonium (mol · l$^{-1}$) | Time (min) | Iron (mg) | Thickness (nm) |
|---|---|---|---|---|
| 0.9 | 0.05 | 1 | 200 | 10 |
| 0.9 | 0.05 | 3 | 200 | 50 |
| 0.9 | 0.05 | 5 | 200 | 90 |
| 0.9 | 0.05 | 10 | 200 | 140 |
| 0.9 | 0.05 | 15 | 200 | 200 |
| 0.45 | 0.025 | 1 | 200 | <10 |
| 0.45 | 0.025 | 3 | 200 | 20 |
| 0.45 | 0.025 | 5 | 200 | 40 |
| 0.45 | 0.025 | 10 | 200 | 90 |
| 0.45 | 0.025 | 15 | 200 | 120 |
| 0.9 | 0.05 | 10 | 5 | <10 |
| 0.9 | 0.05 | 10 | 50 | 30 |
| 0.9 | 0.05 | 10 | 100 | 70 |
| 0.9 | 0.05 | 10 | 150 | 100 |
| 0.9 | 0.05 | 10 | 200 | 150 |

The increase in the exposure time, the primer and the monomer concentrations, and the amount of filings, enables the thickness of the film formed to be increased.

EXAMPLE 2

Test of the Film Thickness

To show the influence of various parameters on the thickness of the organic film, the method was applied to a gold plate, placed in the presence of a solution containing an adhesion primer, 4-aminophenyldiazonium, and a monomer, HEMA, under non-electrochemical conditions allowing for the formation of a radical entity based on the adhesion primer. This choice was motivated in particular by the presence of characteristic absorption bands at 1726, 1454 and 1166 nm of the poly-HEMA.

A solution of adhesion primer in water was prepared by adding 4 ml of a solution of NaNO$_2$ at 0.1 M (4.10$^{-4}$ moles) to 4 ml of a solution at 0.1 M (4.10$^{-4}$ moles) of p-phenylenediamine in HCl (0.5 M), under agitation. 1 ml (8.24 mmoles) of HEMA and a gold plate were added to this solution.

2-1 Influence of the Reaction Time

The solution was then placed under non-electrochemical conditions allowing for the formation of radicals on the adhesion primer by adding 200 mg of iron filings. The plate was then removed from the reaction medium and immediately rinsed with water then acetone and dimethylformamide (DMF) under ultrasound, and finally dried under an argon current.

Figure 4A:
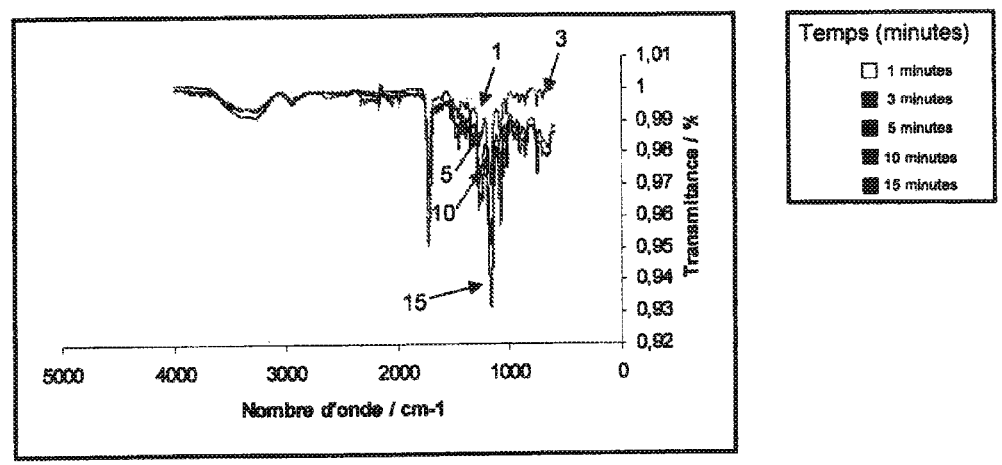
FIG. 4 shows, for a gold plate according to an alternative of the method of this invention, the IR spectrum of said gold plate treated at different exposure times (FIG. 4a) and the IR spectrum of said treated gold plate as a function of the amount of iron filings (FIG. 4b).

As shown by the IR spectrum in FIG. 4a, the time of exposure of the sample to the reaction medium has an influence on the thickness of the film obtained. Indeed, the increase in the intensity of the absorption bands of the HEMA at 1726, 1454 and 1166 nm indicates an increase in the thickness of the film over time.

The thickness of the films was measured using a profilometer: it ranged from 12 nm to 200 nm for an exposure time ranging from 1 to 15 minutes.

2-2 Influence of Non-Electrochemical Conditions Allowing for the Formation of Radicals on the Adhesion Primer Given that the amount of radicals present in the solution has a notable influence on the reaction, the method was carried out with a variable amount of iron filings for a reaction time set at 10 min.

Figure 4B:
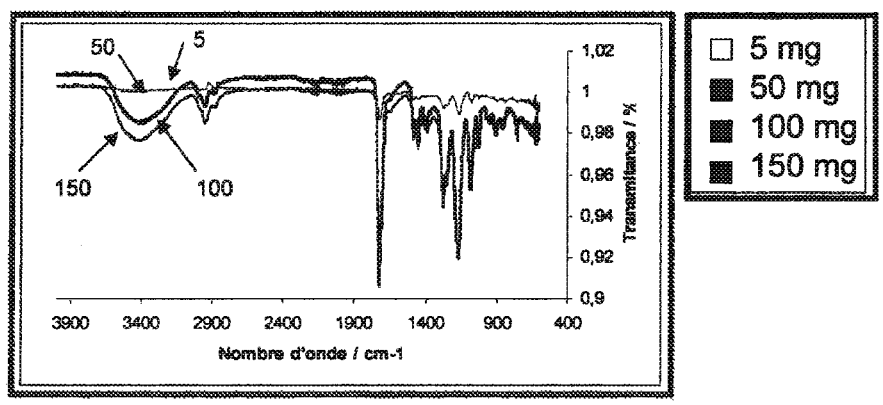

As shown by the IR spectrum in FIG. 4b, the amount of iron filings present in the reaction medium has an influence on the thickness of the film obtained. A minimum amount of filings is necessary in order to generate enough radicals in the reaction medium and make it possible to obtain a grafted film of an IR-detectable thickness. Beyond a certain maximum amount of filings, the variations in thickness of the film obtained are negligible.

EXAMPLE 3

Preparation of a Film on a Gold Plate Using Commercial p-nitrophenyldiazonium and HEMA in the Presence of Iron Filings The experiment was conducted according to the protocol described in example 2, using commercial p-nitrophenyldiazonium (Aldrich®) solubilised at 0.05 M in an HCl solution (0.5 M). The gold plate was then placed in the reactor for around 15 min. The plate was then rinsed with water and acetone, and subjected to ultrasound in DMF and then in water before being dried.

As above, the XPS spectrometry (X photoelectron spectroscopy) and IR analyses confirmed the presence of the film expected, of which the thickness increases with the reaction time.

EXAMPLE 4

Preparation of a Film on a Gold Plate Using a Diazonium Salt Created In Situ and HEMA in a Basic Medium The procedure is identical to that of example 2. 0.3 ml of a NaOH solution at 2.5×10$^{-3}$ M were substituted for the iron filings in order to allow for a slight increase in the pH to above 4.

The XPS and IR analyses confirm the presence of the film expected, of which the thickness increases with the reaction time.

EXAMPLE 5

Preparation of a Film on a Conductive Carbon Felt Using a Diazonium Salt Created In Situ and Acrylic Acid (AA) in the Presence of Iron Filings The example was performed according to the procedure described in example 2. The monomer used in this case was acrylic acid (1 ml) and the sample was constituted by carbon felt.

Figure 5A:
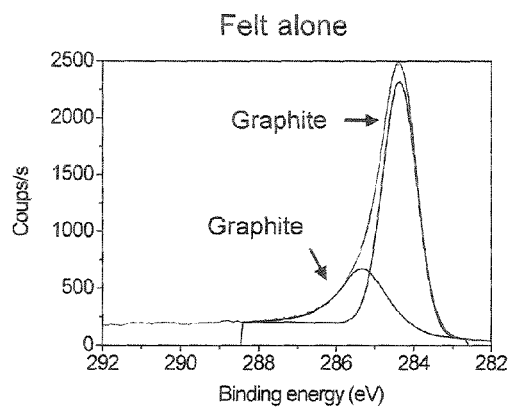
FIG. 5 shows the XPS spectrometry analyses (X photoelectron spectroscopy) of a conductive carbon felt (FIG. 5a) and of the same carbon felt on which an organic film is grafted, which film is prepared according to the method of this invention, i.e. from a diazonium salt created in situ and acrylic acid, in the presence of iron filings (AAP for acrylic acid polymer) (FIG. 5b).
Figure 5B:
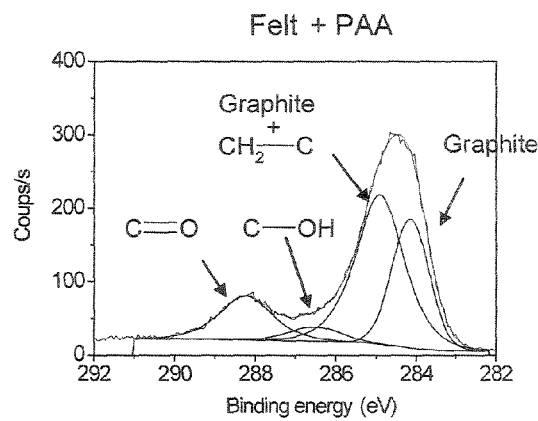

The XPS analysis, as shown by the spectrum of FIG. 5, confirms the presence of the expected film.

EXAMPLE 6

Preparation of a Sequential Film on a Gold Plate Using a Diazonium Salt Prepared In Situ, HEMA and AA in the Presence of Iron Filings First, a plate was prepared and cleaned according to the procedure of example 2.

A new solution of the same diazonium salt was then prepared and, to it, 1 ml of acrylic acid, then 200 mg of iron filings were added. The plate previously prepared according to example 2 was then placed in the reaction medium for a variable time, at the end of which it was cleaned and dried as described above.

Figure 6:
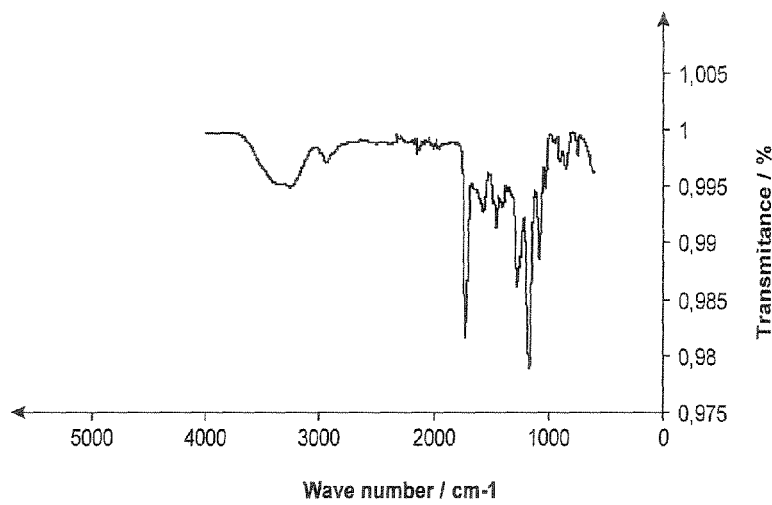
FIG. 6 shows the IR spectrum of a gold plate treated according to the method of this invention for forming a sequential film.

FIG. 6 shows the IR spectrum obtained for such a plate after 15 minutes of reaction. The characteristic bands of the AAP (acrylic acid polymer) at 1590 and 1253 nm appear on the spectrum of example 2.

EXAMPLE 7

Preparation of a Statistical Film on a Gold Plate Using a Diazonium Salt Prepared In Situ, HEMA and AA in the Presence of Iron Filings The procedure used is identical to that of example 2, except that 0.5 ml of acrylic acid and 0.5 ml of HEMA were added to the diazonium salt solution.

Figure 7:
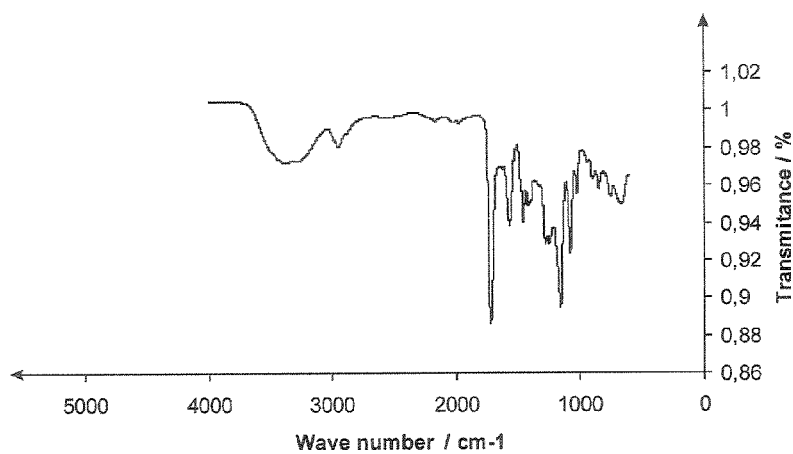
FIG. 7 shows the IR spectrum of a gold plate treated according to the method of this invention for forming a statistical film.

The IR spectrum obtained is shown in FIG. 7: it confirms the presence of the expected statistical film constituted in particular by the two monomers.

EXAMPLE 8

Preparation of a Film on a Gold Plate Using a Diazonium Salt Prepared In Situ and 4-vinyl-pyridine (4VP) in the Presence of Iron Filings 200 mg of iron filings, then a dispersion of 1 ml of 4 vinyl-pyridine in 10 ml of water, prepared by an ultrasound treatment, were added to a diazonium salt solution prepared according to example 2, containing a gold plate.

Figure 8:
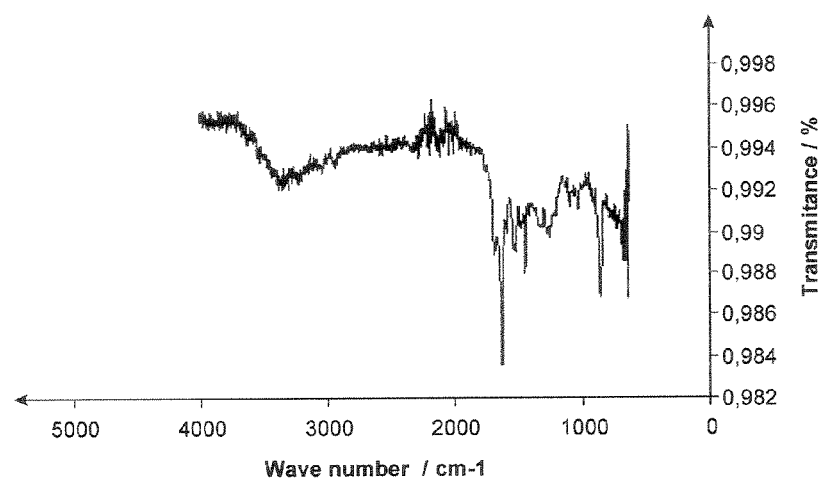
FIG. 8 shows the IR spectrum of a gold plate treated according to the method of this invention for forming a film based on a monomer that is insoluble in the reaction solvent.

The IR spectrum obtained for the plate is shown in FIG. 8. The characteristic bands at 1602, 1554 and 1419 nm validate the presence of the expected film.

EXAMPLE 9

Preparation of a Film on a Glass Plate Using a Diazonium Salt Prepared In Situ and HEMA in the Presence of Iron Filings The protocol is identical to that of example 2, except that a glass plate is used in this case.

Figure 9:
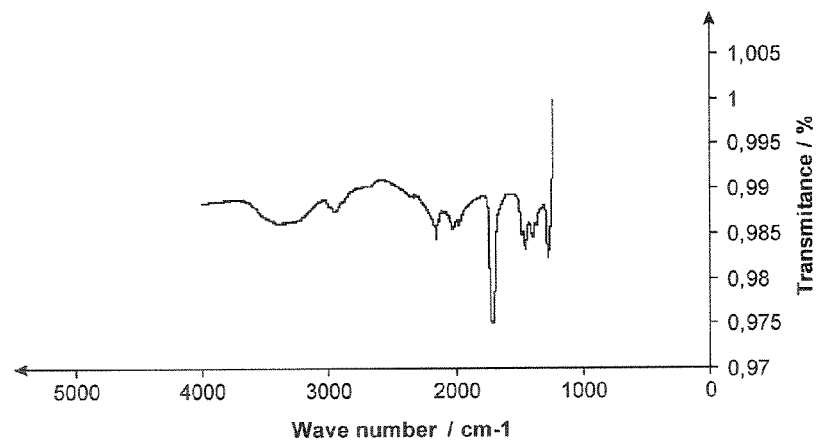
FIG. 9 shows the IR spectrum of a glass plate treated according to the method of this invention.

The IR spectrum shown in FIG. 9 confirms the presence of the expected film, the thickness of which increases with the reaction time.

EXAMPLE 10

Preparation of a Film on Carbon Nanotubes Using a Diazonium Salt Prepared In Situ and HEMA in the Presence of Iron Filings 200 mg of iron filings and 1 ml of HEMA were added to a diazonium salt solution prepared as indicated in example 2. Then, 100 mg of multiwall carbon nanotubes in the form of a carpet were added to this solution. The layer, after reaction, was cleaned according to the protocol described in example 2 before being dried.

Figure 10A:
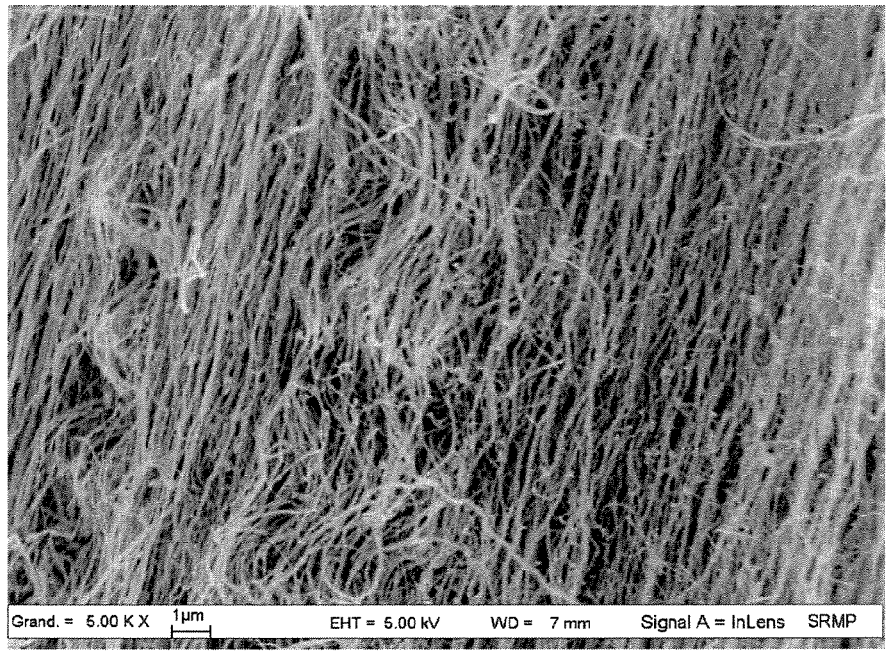
FIG. 10 shows a photograph of carbon nanotubes (FIG. 10a) and a photograph of carbon nanotubes after a treatment according to the invention (FIG. 10b).
Figure 10B:
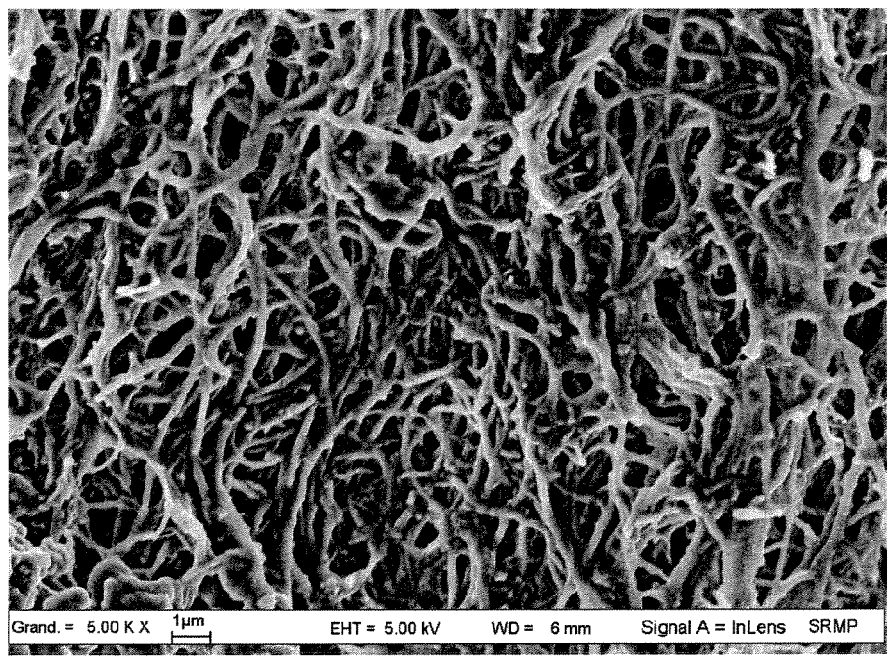

The photographs obtained by scanning electron microscopy (SEM), shown in FIG. 10, correspond to nanotubes before (FIG. 10a) and after (FIG. 10b) treatment.

EXAMPLE 11

Preparation of a Film on a PTFE (Teflon®) Surface Using a Diazonium Salt Prepared In Situ and HEMA in the Presence of Iron Filings 4 ml of a solution of $NaNO_2$ at 0.1 M in water were added to 4 ml of a solution of p-phenylenediamine at 0.1 M in HCl (0.5 M) so as to form the diazonium salt. 1 ml of HEMA, then 200 mg of iron filings were added to this diazonium salt solution. A Teflon® part measuring 4 $cm^2$ was then introduced to the reaction medium for 15 min, the plate was then rinsed in water and acetone and exposed to ultrasound in DMF, then water, before being dried.

Figure 11:
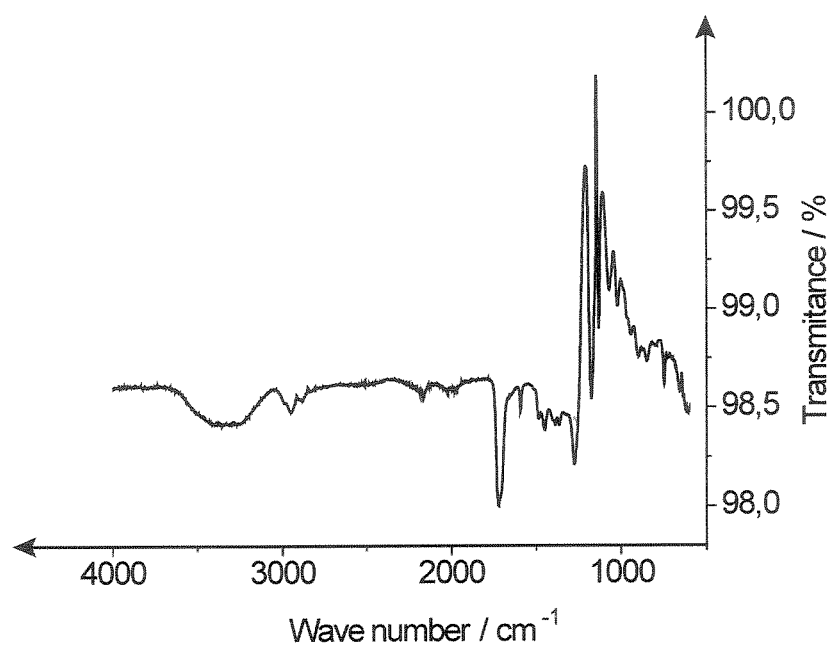
FIG. 11 shows the IR spectrum of a PTFE plate treated according to the method of this invention.

The spectrometry and IR analyses (FIG. 11) confirm the presence of the expected film, the thickness of which increases with the reaction time.

EXAMPLE 12

Application of the Method to Different Samples

The method was successfully applied to a large number of samples of various types, and different monomers were used. The diazonium salt used in this example was prepared in situ using p-phenylenediamine.

The results obtained for each type of sample according to the monomer are shown in table 2 below. For each of the samples tested, the presence of the organic film was verified using IR spectra.

TABLE 2

| Support | Monomer | Time (min) | Film |
|---|---|---|---|
| Gold | HEMA | 15 | yes |
| Gold | Acrylic acid | 15 | yes |
| Gold | Acrylonitrile | 15 | yes |
| Silicon wafer | HEMA | 20 | yes |
| Silicon wafer | Acrylic acid | 20 | yes |
| Silicon wafer | Acrylonitrile | 20 | yes |
| Aluminium | HEMA | 30 | yes |
| Aluminium | Acrylic acid | 30 | yes |
| Aluminium | Acrylonitrile | 30 | yes |
| Nanotubes(c) | HEMA | 15 | yes |
| Nanotubes (c) | Acrylic acid | 15 | yes |
| Felt | HEMA | 15 | yes |
| Felt | Acrylic acid | 15 | yes |
| Felt | Acrylonitrile | 15 | yes |
| Platinum | HEMA | 15 | yes |
| Platinum | Acrylic acid | 15 | yes |
| Platinum | Acrylonitrile | 15 | yes |
| Stainless steel | HEMA | 15 | yes |
| Stainless steel | Acrylic acid | 15 | yes |
| Stainless steel | Acrylonitrile | 15 | yes |
| Zinc | HEMA | 15 | yes |
| Zinc | Acrylic acid | 15 | yes |
| Zinc | Acrylonitrile | 15 | yes |
| Titanium | HEMA | 15 | yes |
| Titanium | Acrylic acid | 15 | yes |
| Titanium | Acrylonitrile | 15 | yes |
| Nickel | HEMA | 15 | yes |
| Nickel | Acrylic acid | 15 | yes |
| Nickel | Acrylonitrile | 15 | yes |
| Wood | HEMA | 45 | yes |
| Paper | HEMA | 45 | yes |
| Cotton | HEMA | 45 | yes |
| Teflon ® | HEMA | 30 | yes |

EXAMPLE 13

Preparation of a Film on Surfaces of Different Types (Gold Plate and Titanium Plate) for the Same Solution 4 ml of a solution of $NaNO_2$ at 0.1 M in water were added to a solution of p-phenylenediamine at 0.1 M in HCl (0.5 M). 1 ml of HEMA, then 200 mg of iron filings were added to this diazonium salt solution. A gold plate and simultaneously a titanium plate measuring 4 $cm^2$ were then placed in the reaction medium for 15 min. The plates were then rinsed with water and acetone, and subjected to ultrasound in DMF, then water, before being dried.

The spectrometry and IR analyses (FIG. 12) confirm the presence of the expected film for the two substrates.

EXAMPLE 14

Preparation of a Film on a Glass Plate Using a Diazonium Salt Prepared In Situ and Butylmethacrylate in the Presence of Iron Filings 200 mg of iron filings, then a dispersion of 1 ml of butylmethacrylate (BUMA) in 10 ml of water prepared by ultrasound were added to a diazonium salt solution prepared according to example 2 and containing a glass plate that has been pre-cleaned by a "piranha" solution treatment (i.e. a mixture of 60/40 by volume of concentrated sulphuric acid and water oxygenated at 110 volumes). After a reaction time of 10 minutes, the plate is then cleaned and dried according to the procedures described above.

A spot test was then performed on the glass plate thus coated (FIG. 13b) and on a pristine glass plate used as a control (FIG. 13a). A change in the physical property of the glass plate thus coated, which becomes water-repellent, can be observed by the variation in the surface angle between the drop and the surface.

EXAMPLE 15

Preparation of a Film on a Gold Plate Having a Commercial Ink Mask Based on a Diazonium Salt Prepared In Situ and Hydroxyethylmethacrylate (HEMA) or Acrylic Acid (AA) in the Presence of Iron Fillings The protocol used is identical to that of example 2 for HEMA and 5 for AA. Prior to its introduction to the reaction medium, the plate was coated with a mask: different patterns were produced on the gold plate using a black-coloured ink felt pen (Staedtler®-Lumocolor®).

After reaction, the plate was washed with water, DMF and acetone in order to remove the reaction products, then washed more vigorously with ultrasound with the same solvents. The surface was then rinsed again with acetone, then dried before being analysed by Infrared spectroscopy (IR) (C═O bands for each of the polymers) and by Atomic Force Microscopy (AFM).

Figure 14A:
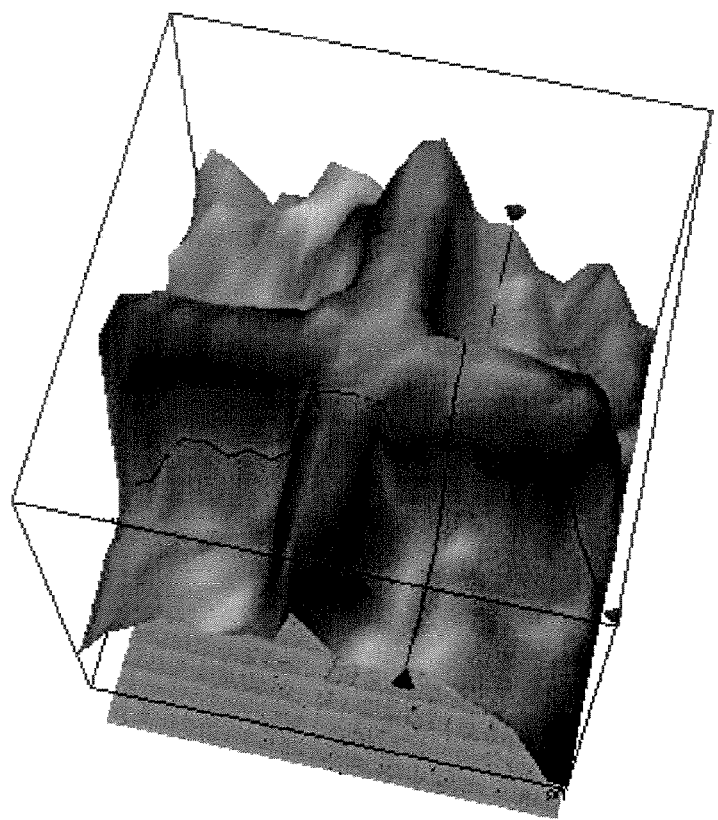
FIG. 14 shows the IR/AFM mapping obtained for gold plates coated with a commercial ink mask after treatment by the process in the presence of hydroxyethylmethacrylate (FIG. 14A) or acrylic acid (FIG. 14B) and removal of the mask.
Figure 14B:
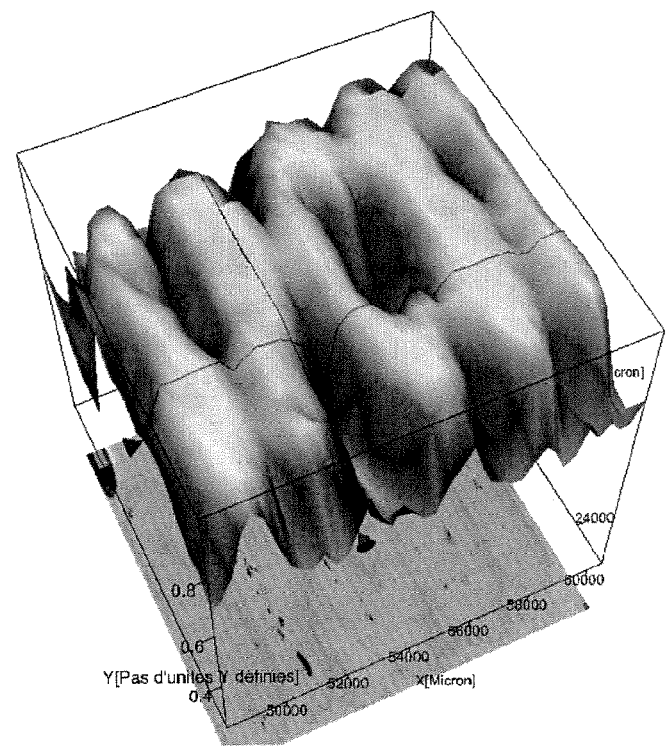

The different mappings (IR/AFM) obtained are shown in FIG. 14. FIG. 14A shows the presence of a cross-shaped pattern and FIG. 14B shows another pattern, which are not covered by the organic film (it is a transmittance measurement, also, the areas in relief correspond to non-grafted areas).

EXAMPLE 16

Preparation of a Film on a Gold Plate Having a Thiol Mask Based on a Diazonium Salt Prepared In Situ and Acrylic Acid (AA) in the Presence of Iron Fillings The protocol used is identical to that of example 5. Prior to its introduction into the reaction medium, a drop of long-chain (C18) ethanolic thiol solution was deposited on the plate, and the plate was treated after evaporation of the ethanol.

After the treatment, the plate was then cleaned and analysed as in example 15.

Figure 15A:
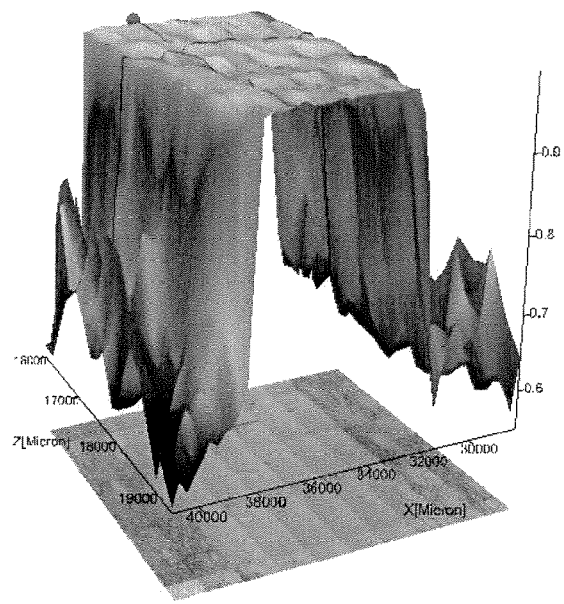
FIG. 15A and FIG. 15B show the IR/AFM mapping obtained for a gold plate coated with a thiol mask after treatment by the process in the presence of acrylic acid and removal of the mask.
Figure 15B:
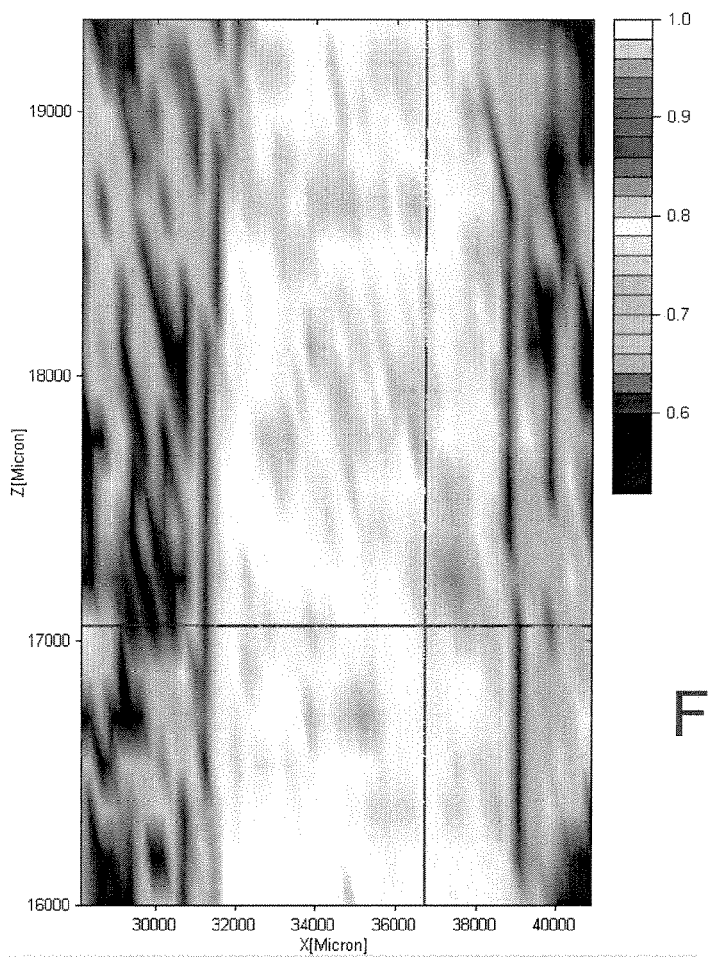

The IR/AFM mapping is shown in FIGS. 15A and 15B, which respectively show a three-dimensional view (a transmittance measurement, also, the areas in relief correspond to the non-grafted areas) and a planar view of the plate (the light area corresponding to the non-grafted area). It can be noted in these figures that the areas that were covered with the mask do not have a grafted film.

EXAMPLE 17

Preparation of a Film on a Gold Surface Having a Thiol Microprinted Mask Based on a Diazonium Salt Prepared In Situ and Hydroxyethylmethacrylate (HEMA) in the Presence of Iron Fillings The protocol used is identical to that of example 5. Prior to its introduction into the reaction medium, the plate is covered with a thiol mask using a PDMS (polydimethylsiloxane) buffer having micrometric patterns and previously impregnated with a long-chain (C18) ethanolic thiol solution. The plate was treated after evaporation of the ethanol.

After the treatment, the plate was cleaned and analysed as in example 15.

Figure 16A:
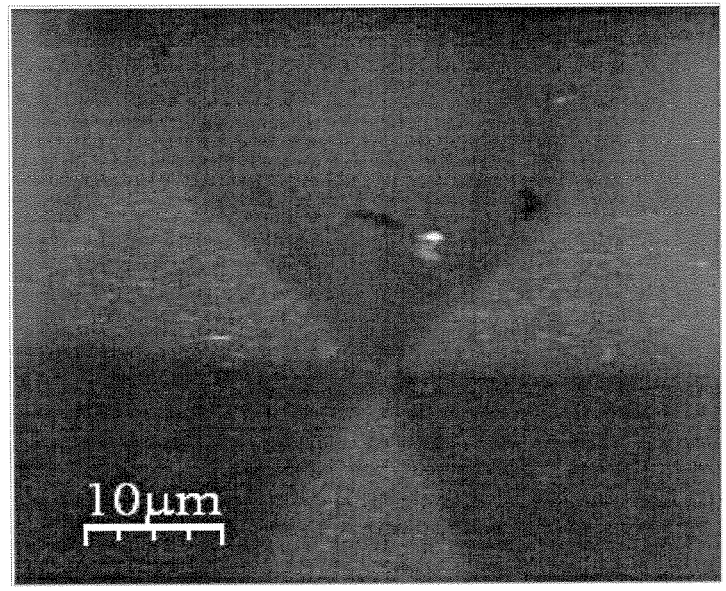
FIG. 16 shows the IR/AFM mapping obtained for a gold plate coated with a thiol mask after treatment by the process in the presence of hydroxyethylmethacrylate and removal of the mask with different patterns (FIG. 16A and FIG. 16B).
Figure 16B:
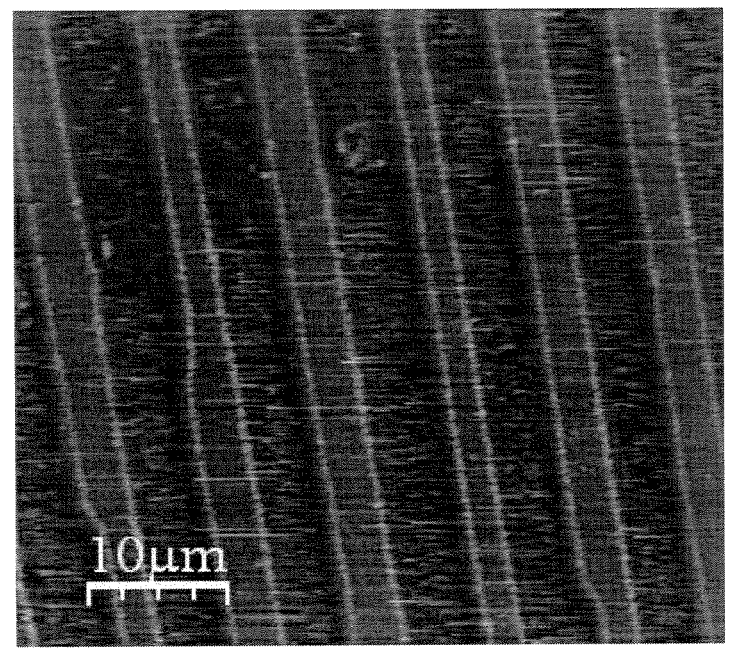

The AFM mapping is shown in FIG. 16A, which shows that the grafted surface corresponds to the reverse of the triangular micrometric patterns appearing on the buffer and in FIG. 16B, which shows micrometric patterns corresponding to lines (a transmittance measurement, also, the areas in relief correspond to the non-grafted areas).

French Application Nos. 06 55653, filed Dec. 19, 2006 and 07 54278, filed Apr. 4, 2007, and U.S. application Ser. No. 11/686,076, filed Mar. 14, 2007 are incorporated herein by reference.

The invention claimed is:

1. A method for preparing an organic film at a surface of a solid support under non-electrochemical conditions, comprising contacting the surface of the solid support with a liquid solution comprising:
   at least one protic solvent,
   at least one adhesion primer,
   at least one radically polymerizable monomer, said monomer being different from the adhesion primer,
   under non-electrochemical conditions generating radical entities based on the adhesion primer, where the adhesion primer generates said radical entities independent of the surface on which said radical entities are intended to be grafted,
   and wherein the surface of the solid support contacted with said liquid solution comprising at least one area covered with a mask to form an organic film covalently grafted on the surface of the solid support, said organic film being polymeric or copolymeric and having a monomer unit sequence in which a first unit is bonded to the solid support and is a derivative of the adhesion primer and the other units are derived from said adhesion primer and from polymerizable monomers.

2. The method of claim 1, wherein said protic solvent is water, optionally acidified, acetic acid, hydroxylated solvents, or ethyleneglycol, and mixtures thereof.

3. The method of claim 1, wherein said adhesion primer is a cleavable aryl salt selected from the group consisting of aryl diazonium salt, aryl ammonium salt, aryl phosphonium salt and aryl sulfonium salt.

4. The method of claim 1, wherein said adhesion primer is a cleavable aryl salt selected from the group consisting of aryl diazonium salt, aryl ammonium salt, aryl phosphonium salt and aryl sulfonium salt and wherein said aryl group comprises an aromatic or heteroaromatic carbon structure, optionally mono- or polysubstituted with at least one substituent, said aromatic or heteroaromatic carbon structure comprising at least one aromatic or heteroaromatic cycle comprising 3 to 8 atoms, said aromatic or heteroaromatic cycle comprising at least one N, O, P or S heteroatom, and the substituent comprising at least one heteroatom or C1 to C6 alkyl group.

5. The method of claim 1, wherein said adhesion primer is a cleavable aryl salt represented by formula (I):

in which:
A represents a monovalent anion and
R represents an aryl group.

6. The method of claim 1, wherein said adhesion primer is a cleavable aryl salt represented by formula (I):

in which:
A represents a monovalent anion and
R represents an aryl group selected from the group consisting of aromatic or heteroaromatic carbon structure, optionally mono- or polysubstituted with at least one substituent, the aromatic or heteroaromatic carbon structure comprising at least one aromatic or heteroaromatic cycle comprising 3 to 8 atoms, the aromatic or heteroaromatic cycle comprising at least one N, O, P or S heteroatom, and the substituent comprising at least one heteroatom or $C_1$ to $C_6$ alkyl group.

7. The method of claim 6, wherein the aromatic or heteroaromatic carbon structures are mono- or polysubstituted with one or more heteroatoms or $C_1$ to $C_6$ alkyl groups.

8. The method of claim 1, wherein said adhesion primer is a cleavable aryl salt represented by formula (I):

in which:
A represents a monovalent anion selected from the group consisting of an inorganic anion, a halogen borate and an organic anion, and
R represents an aryl group.

9. The method of claim 1, wherein said adhesion primer is selected from the group consisting of phenyldiazonium tetrafluoroborate, 4-nitrophenyldiazonium tetrafluoroborate, 4-bromophenyldiazonium tetrafluoroborate, 4-aminophenyldiazonium chloride, 2-methyl-4-chlorophenyldiazonium chloride, 4-benzoylbenzenediazonium tetrafluoroborate, 4-cyanophenyldiazonium tetrafluoroborate, 4-carboxyphenyldiazonium tetrafluoroborate, 4-acetamidophenyldiazonium tetrafluoroborate, 4-phenylacetic acid diazonium tetrafluoroborate, 2-methyl-4-[(2-methylphenyl)diazenyl] benzenediazonium sulphate, 9,10-dioxo-9,10-dihydro-1-anthracenediazonium chloride, 4-nitronaphthalenediazonium tetrafluoroborate and naphthalenediazonium tetrafluoroborate.

10. The method of claim 1, wherein said adhesion primer concentration in said liquid solution is between around $10^{-6}$ and 5 M.

11. The method of claim 1, wherein said radically polymerizable monomer is a molecule comprising at least one ethylene bond.

12. The method of claim 1, wherein said radically polymerisable monomer is a molecule with the following formula (II):

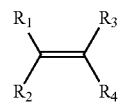

(II)

in which the $R_1$ to $R_4$ groups, identical or different, represent a non-metallic monovalent atom, a hydrogen atom, a —$COOR_5$ group in which $R_5$ represents a hydrogen atom or a $C_1$-$C_{12}$ alkyl group, a nitrile, a carbonyl, an amine or an amide.

13. The method of claim 1, wherein said radically polymerisable monomer is selected from the group consisting of vinyl acetate, acrylonitrile, methacrylonitrile, methyl methacrylate, ethyl methacrylate, butyl methacrylate, propyl methacrylate, hydroxyethyl methacrylate, hydroxypropyl methacrylate, glycidyl methacrylate and their derivatives; acrylamides, cyanoacrylates, di-acrylates and di-methacrylates, tri- acrylates and tri-methacrylates, tetra-acrylates and tetra methacrylates, styrene, parachloro-styrene, pentafluoro-styrene, N-vinyl pyrrolidone, 4-vinyl pyridine, 2-vinyl pyridine, vinyl halides, di-vinylbenzene (DVB), and vinyl cross-linking agents based on acrylate, methacrylate and derivatives thereof.

14. The method of claim 1, wherein the amount of said radically polymerisable monomer represents between 18 and 40 times the solubility of said monomer at room temperature in the liquid solution.

15. The method of claim 1, wherein said liquid solution also comprises at least one surfactant.

16. The method of claim 1, wherein said method further comprises dispersing or emulsifying said polymerizable monomer in the presence of at least one surfactant, or by ultrasound, before it is mixed with the at least one protic solvent and the at least one adhesion primer.

17. The method of claim 1, wherein the non-electrochemical conditions allowing for the formation of radical entities are selected from the group consisting of thermal, kinetic, chemical, photochemical or radiochemical conditions and a combination thereof, to which the adhesion primer is subjected.

18. The method of claim 1, wherein the non-electrochemical conditions allowing for the formation of radical entities are chemical conditions.

19. The method of claim 1, wherein said liquid solution further comprises at least one chemical initiator.

20. The method of claim 1, wherein said method comprises:
adding said at least one monomer to a solution comprising said at least one adhesion primer different from said monomer in the presence of said at least one protic solvent and optionally at least one chemical initiator to produce a second solution, placing the second solution under said non-electrochemical conditions allowing for the formation of radical entities based on said adhesion primer and possibly based on said chemical initiator, to produce a third solution, placing the surface of the solid support in contact with the third solution.

21. The method of claim 1, wherein said method comprises:

placing the surface of the solid support in contact with a solution comprising said at least one adhesion primer in the presence of said at least one protic solvent, and optionally at least one chemical initiator and at least one monomer, to produce a second solution, placing the surface of the solid support in contact with the second solution under non-electrochemical conditions allowing for the formation of radical entities based on said adhesion primer and possibly based on said chemical initiator, to produce a third solution, optionally adding said at least one monomer to the third solution.

22. The method of claim 1, wherein said method further comprises cleaning the surface on which the organic film is to be formed.

23. The method of claim 1, wherein the surface of said solid support has at least one atom capable of being involved in a radical reaction.

24. The preparation method of claim 1, wherein said solid support and/or the surface of said solid support comprises at least one material selected from the group consisting of metal, wood, paper, cotton, felt, silicon, a carbon nanotube and a fluoro-polymer.

25. The method of claim 1, wherein said solid support is either electrically conductive or non-electrically conductive.

26. The method of claim 1, wherein the surface of the solid support contacted with said liquid solution comprises at least one area covered with a mask and wherein the mask is not soluble in the protic solvent of said liquid solution.

27. The method of claim 1, wherein the surface of the solid support contacted with said liquid solution comprises at least one area covered with a mask and wherein the mask can be removed by chemical washing.

28. The method of claim 1, wherein the surface of the solid support contacted with said liquid solution comprises at least one area covered with a mask composed of alkylthiols.

29. A method for preparing an organic film, comprising contacting a surface of a solid support with a liquid solution to form an organic film on the surface of the solid support, the solution comprising:

at least one protic solvent,
at least one adhesion primer,
at least one radically polymerizable monomer, said monomer being different from the adhesion primer,
under non-electrochemical conditions generating radical entities based on the adhesion primer, where the adhesion primer generates radical entities independent of the surface on which which said radical entities are intended to be bonded, and when the non-electrical conditions are chemical and include a chemical initiator, the chemical initiator is different from the solid support, and
wherein the surface of the solid support contacted with said liquid solution comprising at least one area covered with a mask,
wherein the organic film is polymeric or copolymeric and has a monomer unit sequence in which a first unit is bonded to the solid support and is a derivative of the adhesion primer and other units are derived from said adhesion primer and from polymerizable monomers.

* * * * *